United States Patent
Seki et al.

(10) Patent No.: US 6,593,643 B1
(45) Date of Patent: Jul. 15, 2003

(54) SEMICONDUCTOR DEVICE LEAD FRAME

(75) Inventors: Kazumitsu Seki, Nagano (JP); Takashi Yoshie, Nagano (JP); Harunobu Sato, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/719,329

(22) PCT Filed: Mar. 24, 2000

(86) PCT No.: PCT/JP00/01836
§ 371 (c)(1),
(2), (4) Date: Dec. 7, 2000

(87) PCT Pub. No.: WO00/62341
PCT Pub. Date: Oct. 19, 2000

(30) Foreign Application Priority Data

Apr. 8, 1999 (JP) ............................................. 11-101380
Jan. 21, 2000 (JP) ......................................... 2000-013462

(51) Int. Cl.[7] ............................................... H01L 23/532
(52) U.S. Cl. .................... 257/677; 257/787; 29/856; 29/883
(58) Field of Search ................................ 428/675, 626, 428/620, 670, 672, 673, 680, 674, 676; 257/677, 787, 666, 687; 29/827, 855, 856, 883

(56) References Cited

U.S. PATENT DOCUMENTS 5,650,661 A * 7/1997 Mathew ....................... 257/677
6,034,422 A * 3/2000 Horita et al. ................. 257/666
6,037,653 A * 3/2000 Kim et al. .................... 257/666
6,203,931 B1 * 3/2001 Chu et al. .................... 428/670

FOREIGN PATENT DOCUMENTS

| JP | 53-141577 | * 12/1978 |
| JP | 58-181888 | * 10/1983 |
| JP | 60-147147 | * 8/1985 |
| JP | 63041057 | 2/1988 |
| JP | 01-212790 | * 8/1989 |
| JP | 04-212443 | * 8/1992 |
| JP | 5-19820 | 3/1993 |
| JP | 05-117898 | * 5/1993 |
| JP | 07-050377 | * 2/1995 |
| JP | 07-307426 | * 11/1995 |
| JP | 09-116065 | * 5/1997 |
| JP | 09-195068 | * 7/1997 |

* cited by examiner

Primary Examiner—John J. Zimmerman
(74) Attorney, Agent, or Firm—Paul & Paul

(57) ABSTRACT

A semiconductor device lead frame made of copper or a copper alloy used for a resin sealing type semiconductor device, comprising a lead frame body made of copper or a copper alloy, a double-layer under plating film formed on the lead frame body and comprising a lower layer made of zinc or a copper-zinc alloy and an upper layer made of copper having a thickness of 0.02 to 0.4 μm and a precious metal plating film formed on at least a wire bonding portion of an inner lead of the copper upper layer of the under plating film. This lead frame is excellent in adhesion with a sealing resin, is free from contaminate a precious metal plating solution (particularly a silver plating solution), has a good appearance of the precious metal plating film, is excellent in corrosion resistance and moisture resistance, and has a good appearance and adhesion of an external solder plating film.

8 Claims, 4 Drawing Sheets

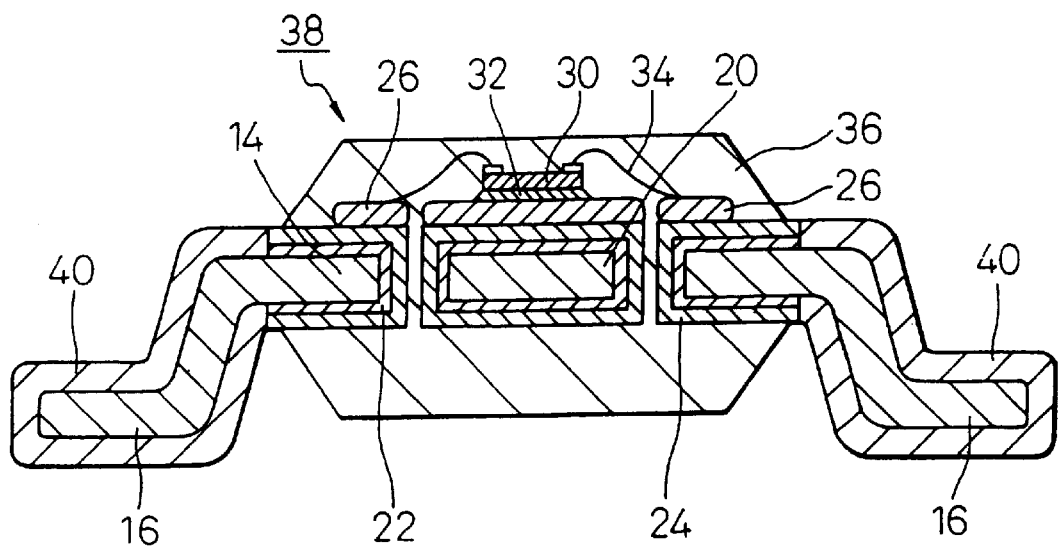
Fig. 3
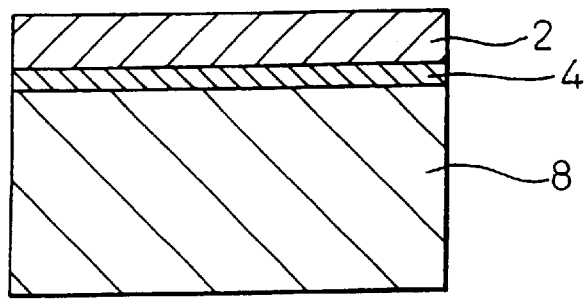
(Prior Art) Fig. 4
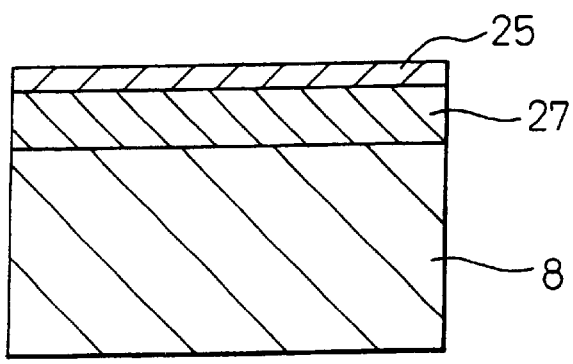
Fig. 5

SEMICONDUCTOR DEVICE LEAD FRAME

TECHNICAL FIELD

The present invention relates to a semiconductor device lead frame, a process of production of the same, a semiconductor device using the lead frame, and a process of production of the same.

BACKGROUND ART

A semiconductor device lead frame used in a resin sealing type semiconductor device is made using, other than an iron-nickel-based alloy (representatively Fe-42% Ni alloy), a copper-based material made of copper or a copper alloy.

In the case of a lead frame using this copper-based material, in order to flatten the surface and improve adhesion of a silver or other precious metal plating film to be formed later, generally, a copper strike plating film is formed on the surface of the material, then the above precious metal plating film for improving die bonding and wire bonding is formed on a die pad and on wire bonding portions of inner leads.

When using a copper-based material, due to exposure to a high temperature of about 150° C. to 350° C. in the step of mounting a semiconductor chip on the lead frame to assemble a semiconductor device, there is a problem that an oxide film of copper is apt to be formed and therefore the adhesion between the sealing resin and the lead frame body made of the copper alloy material will be hindered.

Particularly, when the material is a copper alloy, if exposed to a high temperature, oxidation progresses from the surface of the material to the inside of the material due to oxygen, a segregation layer is formed by the additional element of the copper alloy (layer due to the oxide of the additional element) at an interface between the formed oxide film of copper and the copper alloy material, and the oxide film of the copper ends up being peeled off together with this segregation layer. This is caused by the large difference in density between the copper oxide film and segregation layer and the copper alloy material and therefore mismatching or incoherency at the interface. As a result, when the semiconductor device is finally completed, a problem arises in the adhesion with the sealing resin.

In order to solve this problem, Japanese Examined Patent Publication (Kokoku) No. 5-19820 proposes a semiconductor device lead frame comprised of a lead frame material made of copper or a copper alloy on which is formed a copper-zinc alloy plating film serving as an under plating of the precious metal plating (silver plating).

In the above proposed lead frame, the zinc of the copper-zinc plating film acts as a barrier against diffusion of the oxygen from the outside and suppress the formation of the segregation layer, whereby a semiconductor device lead frame excellent in adhesion with the sealing resin is obtained.

The above proposed lead frame, however, suffered from the following problems (1) to (4):

(1) When plating a precious metal (plating silver as a representative case) on a copper-zinc alloy plating film in a later step, the zinc of the copper-zinc alloy plating film leaches into the precious metal plating solution and contaminates it, so the precious metal plating film becomes irregular or uneven and, in addition, the adhesion of the precious metal plating film is lowered.

(2) When plating a precious metal (plating silver) on the wire bonding portions, an unnecessary silver plating film is formed up to an inner lead side or back side. When peeling off this unnecessary silver plating film, the zinc of the copper-zinc alloy plating film leaches into the peeling solution, so not only is the original barrier function of the copper-zinc alloy plating film degraded, but also patch-like irregularities or unevenness are formed at the surface left after the peeling and the appearance is remarkably degraded.

(3) In the step of assembling the semiconductor device, an external solder plating film is formed on the outer leads after sealing by the resin. This external solder plating is directly formed on the lead frame material exposed by removal of the copper-zinc alloy plating film. If any of the copper-zinc alloy plating film remains on the surface of the material after the step of removing it, patch-like irregularities or unevenness will form at the solder plating film and the appearance will be degraded and, at the same time, the adhesion of the solder plating film will be lowered.

(4) Without a precious metal plating, outer leads cannot satisfy the requirements of corrosion resistance and moisture resistance if there is any zinc, which is highly corrodible, at the surface. The surface ends up degrading before the step of mounting the semiconductor chip to assemble the semiconductor device. Therefore, this lead frame is not practical.

DISCLOSURE OF THE INVENTION

An object of the present invention is to provide a semiconductor device lead frame excellent in an adhesion with a sealing resin, free from contamination of a precious metal plating solution (particularly a silver plating solution), having a good appearance of the precious metal plating film, excellent in corrosion resistance and moisture resistance, and having a good appearance and adhesion of an outer lead solder plating film, a process of production of the same, a semiconductor device using the lead frame, and a process of production of the same.

To attain the above object, according to a first aspect of the present invention, there is provided a semiconductor device lead frame made of copper or a copper alloy and used for a resin sealing type semiconductor device, comprising:

a lead frame body made of copper or a copper alloy, a double-layer under plating film formed on the lead frame body and consisting of a lower layer made of zinc or a copper-zinc alloy and an upper layer made of copper having a thickness of 0.02 to 0.4 $\mu$m, and a precious metal plating film formed on at least a wire bonding portion of an inner lead of the copper upper layer of the under plating film.

According to a second aspect of the present invention, there is provided a semiconductor device lead frame made of copper or a copper alloy and used for a resin sealing type semiconductor device, comprising:

a lead frame body made of copper or a copper alloy, a double-layer under plating film formed on the lead frame body and consisting of a lower layer made of one type of metal selected from silver, tin, iron, cadmium, a copper-nickel alloy, and copper-cadmium and an upper layer made of copper, and a precious metal plating film formed on at least a wire bonding portion of an inner lead of the copper upper layer of the under plating film.

In the past, due to the heat treatment when mounting a semiconductor chip on a lead frame made of copper or a copper alloy in the step of assembling the semiconductor device, an oxide film was formed at the interface between the copper under plating film and the lead frame material, so the adhesion between the sealing resin and the lead frame was lowered.

In the first aspect of the present invention, provision is made of a double-layer under plating film consisting of a lower layer made of zinc or a copper-zinc alloy and an upper layer made of copper having a thickness of 0.02 to 0.4 μm.

By setting the thickness of the copper upper layer provided on the zinc or the copper-zinc alloy lower layer to at least 0.02 μm, formation of an oxide film at the interface between the under plating film and the lead frame material can be prevented. Namely, in the heat treatment when mounting the semiconductor chip, the copper plating film at the surface layer is oxidized, but after the zinc or the copper-zinc alloy plating film is oxidized, oxygen will no longer reach the copper alloy material of the lead frame body, oxidation of the material will be greatly suppressed, and, as a result, no segregation layer of the additional element of the alloy (layer of the oxide of the alloy element) will be formed, so that the peeling of the oxide film and the interface of the material can be prevented.

Further, the zinc or the copper-zinc alloy plating film of the lower layer is covered by the copper plating film of the upper layer and therefore is not exposed. Due to this, the following effects 1) to 3) are further obtained in addition to the effect described above.

1) When forming a precious metal plating film (particularly a silver plating film) on the under plating film, the zinc will not leach out and contaminate the precious metal plating solution and sufficient adhesion of the precious metal plating film can be secured.

2) Also, when peeling off the unnecessary precious metal plating film on the inner lead side and back side, zinc will not leach out into the peeling solution, so the function of the required locations of the zinc or copper-zinc alloy plating film will be secured, no patch-like irregularities or unevenness will form at the surface at locations where the precious metal plating film is not formed, and a good appearance can be secured.

3) When washing with an alkali to remove the resin flashes, a step performed before the external solder plating of the outer lead, the amphoteric and fast reacting zinc will not leach out into the alkali washing solution, so there is no unevenness of the solder plating film due to abnormal precipitation in the solder plating or heating and a good appearance is secured.

On the other hand, by setting the thickness of the copper upper layer to not more than 0.4 μm, the under plating film can be completely removed by washing by an acid before the external solder plating of the outer leads (after washing by an alkali to remove the resin flashes), therefore no under plating film will remain and lower the appearance and the adhesion of the solder plating film.

This is particularly important for securing a good solder bonding strength. Namely, when soldering the surface of the material of a lead frame made of copper or a copper alloy with tin and lead (Sn—Pb), an $Sn_3Cu_4$ intermetallic compound is formed at the interface of the material and solder. The resultant bonding structure [$Cu/Sn_3Cu_4$/Sn—Pb] provides a high bonding strength.

As opposed to this, when zinc remains on the surface of the material, the formation of the $Sn_3Cu_4$ intermetallic compound when soldering is obstructed since zinc is interposed between the solder and the material at the locations where the zinc remains. The bonding structure [Cu/Zn/Sn—Pb] obtained as a result of this has a low bonding strength at the Cu/Zn interface and the Zn/Sn—Pb interface, so the solder bonding strength is lowered.

To remove the under plating film before the outer lead solder plating, the standard practice is to use sulfuric acid or another acid having a concentration of about 10 to 15 v/v % and a pH of about 1. With an acid weaker than this, the removal time becomes extremely long, while with an acid stronger than this, the surface of the outer leads become rough, so neither are practical.

The thickness of the copper upper layer is further desirably set at 0.1 to 0.3 μm by which the, above effects are obtained most stably.

The zinc or zinc alloy lower layer is made thick enough to prevent the oxidation at the interface between the copper or copper alloy material and the under plating film and thin enough to be easily removed by the acid washing before the outer lead solder plating. From this viewpoint, the lower layer can be formed as a strike plating film having a thickness of about 0.001 to 0.5 μm, desirably about 0.01 μm.

In the second aspect of the invention, provision was made of a double-layer under plating film comprised of a lower layer made of one type of metal selected from among silver, tin, iron, cadmium, copper-nickel alloy, and copper-cadmium and an upper layer made of copper In the second aspect of the invention, the metal of the lower layer has a higher corrosion resistance and oxidation resistance than zinc and does not leach out much into acid, so the thickness of the copper upper layer can be reduced from that in the first aspect of the invention. Generally, the thickness of the copper upper layer is set at 0.1 to 0.3 μm. The lower layer can be formed as a strike plating film having a thickness of about 0.001 to 0.5 μm, desirably about 0.01 μm, from the same viewpoint as the first aspect of the invention.

Further, according to a third aspect of the invention, there is provided a semiconductor device lead frame made of copper or a copper alloy and used for a resin sealing type semiconductor device, comprising:

a lead frame body made of copper or a copper alloy, an under plating film made of a copper-nickel alloy or a copper-cadmium alloy formed on the lead frame body, and a precious metal plating film formed on at least a wire bonding portion of an inner lead of the under plating film.

A copper-nickel alloy and a copper-cadmium alloy particularly have a high corrosion resistance and oxidation resistance and do not leach out much into an acid, therefore can be formed as the under plating film without the copper upper layer. Note that when compared with the first aspect of the invention and the second aspect of the invention provided with the under plating film of a double-layer structure, the adhesion of the oxide film formed at the interface with the precious metal plating film is somewhat low, so it is desirable to suitably select the application. In this case as well, the under plating film can be formed as a strike plating film having a thickness of about 0.001 to 0.5 μm, desirably about 0.01 μm, from the same viewpoint as the lower layer of the first aspect of the invention.

The process of production of a semiconductor device lead frame of the first aspect of the present invention comprises:

a step of forming a lead frame body made of copper or a copper alloy, a step of forming a lower layer plating film made of zinc or a copper-zinc alloy on the lead frame body, a step of forming an upper layer copper plating film having a thickness of 0.02 to 0.4 μm on the zinc or the copper-zinc alloy lower layer plating film and thereby forming a double-layer under plating film consisting of the lower layer and the upper layer, and a step of forming a precious metal plating film on at least a wire bonding portion of an inner lead of the upper layer copper plating film.

The thickness of the upper layer copper plating film is most desirably 0.1 μm to 0.3 μm from the same viewpoint as the first aspect of the invention. Also, the zinc or the copper-zinc alloy lower layer can be formed as a strike plating film having a thickness of about 0.001 to 0.5 μm, desirably about 0.01 μm, from the same viewpoint as the first aspect of the invention.

Further, a semiconductor device using a lead frame of the first, second, or third aspect of the invention is formed by mounting a semiconductor chip on a lead frame, electrically connecting the semiconductor chip and the wire bonding portions of said inner leads by bonding wires, and sealing said semiconductor chip by a resin.

Generally, the under plating film on the outer leads of the lead frame is removed (peeled off), and the solder plating film is formed on the exposed outer leads.

Particularly, the process of production of a semiconductor device using a lead frame of the first aspect of the invention comprises:

a step of forming a lead frame body made of copper or a copper alloy, a step of forming a lower layer plating film made of zinc or a copper-zinc alloy on the lead frame body, a step of forming an upper layer copper plating film having a thickness of 0.02 to 0.4 μm on the zinc or the copper-zinc alloy lower layer plating film and thereby forming an under plating film consisting of the lower layer and the upper layer, a step of forming a precious metal plating film on at least a wire bonding portion of an inner lead of the upper layer copper plating film, a step of mounting a semiconductor chip on a die pad of the lead frame formed with the under plating film and the precious metal plating film, a step of electrically connecting the semiconductor chip and the wire bonding portions of the inner leads of the lead frame by bonding wires, a step of sealing the semiconductor chip with a sealing resin, a step of removing the under plating film consisting of the lower layer and the upper layer from the outer leads of the lead frame, and a step of forming a solder plating film on the exposed outer leads.

BRIEF DESCRIPTION OF THE DRAWINGS

FIG. 3 is a sectional view of a semiconductor device according to the present invention, FIG. 4 is a sectional view of a state of formation of an oxide film in a case of a conventional plating structure, FIG. 5 is a sectional view of a state of formation of an oxide film in a case of a plating structure of the present invention shown in FIG. 2

BEST MODE FOR WORKING THE INVENTION

Below, preferred embodiments of the present invention will be explained in detail based on the attached drawings.

Embodiment 1

Figure 1:
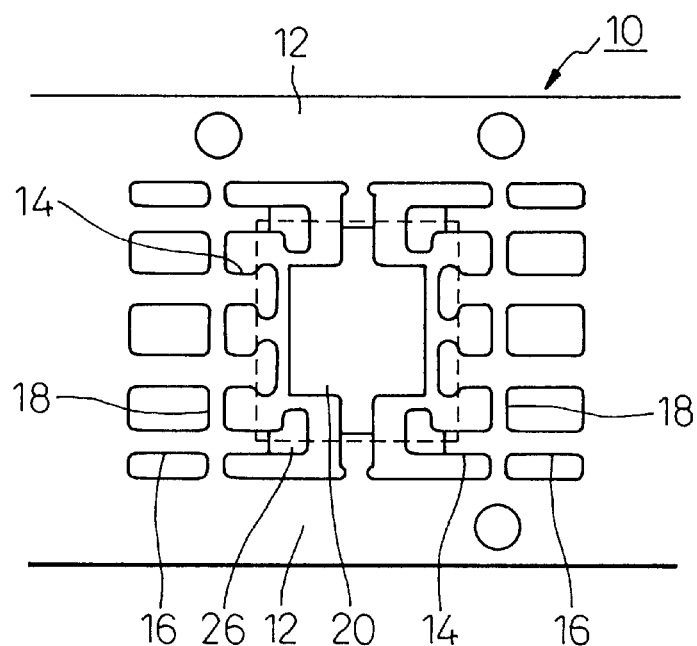
FIG. 1 is a plan view of an example of a lead frame pattern.
Figure 2:
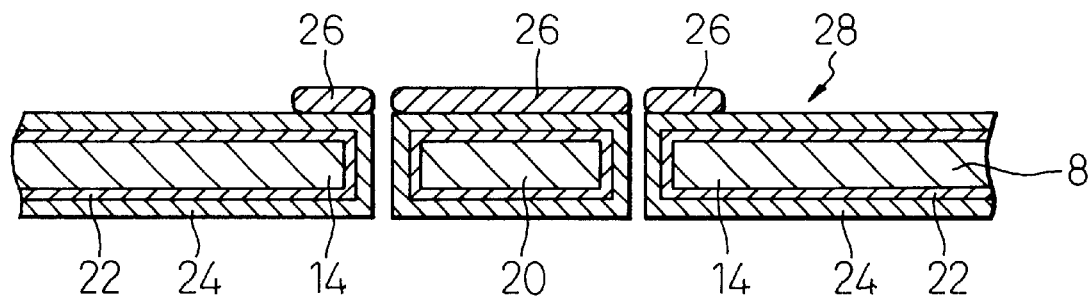
FIG. 2 is a sectional view of a plating structure of a lead frame.

According to the first aspect of the invention, as shown in FIG. 1 and FIG. 2, a copper-based material 8 is pressed or etched to form a lead frame body 10 having a frame 12, inner leads 14, outer leads 16, tie bars 18, and a die pad 20. As the copper-based material, use can be made of various materials such as pure copper, a copper-tin alloy, a copper-zinc alloy, a copper-iron alloy, and a copper-chromium alloy.

Next, a zinc plating film 22 is formed on the entire surface of this lead frame body 10. The zinc plating film 22 is formed as a strike plating film having a thickness of about 0.001 to 0.5 μm, desirably about 0.01 μm.

Next, a copper plating film 24 having a thickness of 0.02 to 0.4 μm is formed on this zinc plating film 22. The thickness of the copper plating film 24 is further desirably 0.1 to 0.3 μm.

Next, a precious metal plating film 26 made of silver, gold, palladium, a double layer of lower layer palladium/upper layer gold, or the like is formed on the die pad 20 of the lead frame body 10 and the wire bonding portions of the inner leads 14 to complete a semiconductor device lead frame 28. Note that, it is not always necessary to form the precious metal plating film 26 on the die pad 20.

There was no contamination of the precious metal plating solution (particularly the silver plating solution), no poor adhesion (deterioration) of the precious metal plating film nor poor appearance, and the appearance of the surrounding copper plating film 24 was good.

As shown in FIG. 3, a semiconductor chip 30 is mounted on the semiconductor device lead frame 28 by using an adhesive 32, the semiconductor chip 30 and the wire bonding portions of the inner leads 14 are electrically connected by bonding wires 34, and the semiconductor chip 30 is sealed by a sealing resin 36, whereby a semiconductor device 38 was completed.

The adhesion with the sealing resin when completing the semiconductor device was also good.

Note that reference numeral 40 is an external solder plating film formed on the outer leads 16. This external solder plating film 40 may be directly formed on the outer leads 16 exposed by peeling off the copper plating film 24 and the zinc plating film 22 from the outer leads 16. In this case, as described before, by forming the copper plating film 24 to a small thickness of about 0.4 μm, desirably about 0.1 μm to 0.3 μm, the peeling by the peeling solution can be easily and completely carried out. Further, the zinc plating film 22 of the lower layer is very thin as described above, so this also can be easily peeled off. Since the under plating film can be completely peeled in this way, a solder plating film 40 can be formed with a good adhesion and good appearance.

An example of the composition of the zinc plating solution and plating conditions is shown below:

| Plating solution composition | |
|---|---|
| NaOH | 5 g/liter |
| NaCN | 35 g/liter |

-continued

| Plating solution composition | |
|---|---|
| Zn(CN)$_2$ | 30 g/liter |
| Current density | 1 A/dm$^2$ |
| Bath temperature | 50° C. |

An example of the composition of the copper plating solution and plating conditions is shown below:

| Plating solution composition | |
|---|---|
| NaOH | 5 g/liter |
| NaCN | 35 g/liter |
| K$_2$CU(CN)$_3$ | 100 g/liter |
| Current density | 3 A/dm$^2$ |
| Bath temperature | 50° C. |

EXAMPLES 1, 2, 3

A zinc plating film of 0.01 μm was formed on a copper alloy material (Cu and 1 to 3 wt % Sn alloy, same below) using the above plating solution. Copper plating films having thicknesses of 0.1 μm, 0.3 μm, and 0.4 μm were formed on such a zinc plating film using the above plating solution.

Embodiment 2

According to the first aspect of the invention, a copper-zinc alloy plating film 22 is formed in place of the zinc plating film 22 on the lead frame body 10. Also, a copper-zinc alloy plating film is formed as a strike plating film having a thickness of about 0.001 to 0.5 μm, desirably about 0.01 μm.

The composition of the copper-zinc alloy plating film is 10 to 90 wt % of copper and the remainder of zinc.

Next, a copper plating film 24 is formed on the copper-zinc alloy plating film 22. The copper plating film 24 is preferably a strike plating film having a thickness of 0.02 μm to 0.4 μm, preferably about 0.1 μm to 0.3 μm. The adhesion between the copper-zinc alloy plating film and the copper plating film is good.

Next, in the same way as the above description, a precious metal plating film 26 made of silver, gold, palladium, a double layer of a lower layer of palladium and an upper layer of gold, or the like is formed on the die pad 20 of the lead frame body 10 and the wire bonding portions of the inner leads 14 to thereby complete the semiconductor device lead frame 28. Note that it is not always necessary to form the precious metal plating film 26 on the die pad 20.

There was no contamination of the precious metal plating solution (particularly the silver plating solution), no poor adhesion (deterioration) of the precious metal plating film, and no poor appearance.

By mounting a semiconductor chip 30 on the semiconductor device lead frame 28 by an adhesive 32, electrically connecting the semiconductor chip 30 and the wire bonding portions of the inner leads 14 by bonding wires 34, and sealing the semiconductor chip 30 by a resin, it is possible to complete the semiconductor device 38. The adhesion with the sealing resin when this semiconductor device 38 was completed was good. Note that the outer lead solder plating film 40 is formed in the same way as described above.

An example of the composition of the copper-zinc alloy plating solution and plating conditions is shown below:

| Plating solution composition | |
|---|---|
| NaOH | 5 g/liter |
| NaCN | 35 g/liter |
| Zn(CN)$_2$ | 5 g/liter |
| K$_2$Cu(CN)$_3$ | 100 g/liter |
| Current density | 5 A/dm$^2$ |
| Bath temperature | 50° C. |

EXAMPLES 4, 5, 6

A copper-zinc (copper 50 and zinc 50) alloy plating film was formed on a copper alloy material using the above plating solution. Copper plating films having thicknesses of 0.1 μm, 0.3 μm, and 0.4 μm were formed on such copper-zinc alloy plating films using the above plating solution.

EXAMPLES 7, 8, 9

A copper-zinc (copper 80 and zinc 20) alloy plating film was formed on a copper alloy material using the above plating solution. Copper plating films having thicknesses of 0.1 μm, 0.3 μm, and 0.4 μm were formed on such copper-zinc alloy plating films using the above plating solution.

Embodiment 3

According to the second aspect of the invention, a plating film 22 made of silver, tin, iron, or cadmium and having substantially the same thickness as that of the zinc plating film 22 was formed on the lead frame body 10 in place of the zinc plating film 22 of Embodiment 1. There was no contamination of the precious metal plating solution (particularly the silver plating solution), no poor adhesion (deterioration) of the precious metal plating film, and no poor appearance either. Further, the adhesion with the sealing resin when completing the semiconductor device was good.

EXAMPLE 10

A silver plating film having a thickness of 0.01 μm was formed on a copper alloy material. A copper plating film having a thickness of 0.1 μm was formed on this silver plating film.

EXAMPLE 11

A tin plating film having a thickness of 0.01 μm was formed on a copper alloy material. A copper plating film having a thickness of 0.1 μm was formed on this tin plating film.

EXAMPLE 12

An iron plating film having a thickness of 0.01 μm was formed on a copper alloy material. A copper plating film having a thickness of 0.1 μm was formed on this iron plating film.

EXAMPLE 13

A cadmium plating film having a thickness of 0.01 μm was formed on a copper alloy material. A copper plating film having a thickness of 0.1 μm was formed on this cadmium plating film.

Embodiment 4

According to the third aspect of the invention, a copper-nickel alloy plating film 22 is formed on a lead frame body

10. The thickness of the copper-nickel alloy plating film 22 is preferably approximately 0.1 μm. As the copper-nickel alloy plating solution, use can be made of a usual plating solution. In the case of the copper-nickel alloy plating film 22 as well, the ratio of the copper is 10 to 90 wt %, and the remainder is nickel.

Next, a precious metal plating film 26 made of silver, gold, palladium, a double layer plating film of a lower layer of palladium and an upper layer of gold (gold plating film being upper layer), etc. is formed on the die pad of the lead frame body 10 and on the wire bonding portions of the inner leads to thereby complete the semiconductor device lead frame. An outer lead solder plating film is formed in the same way as that described above.

In this embodiment as well, there was no contamination of the precious metal plating solution (particularly the silver plating solution). Further, the adhesion with the sealing resin when completing the semiconductor device was good.

EXAMPLE 14

A copper-nickel alloy plating film having a thickness of 0.1 μm was formed on a copper alloy material.

Embodiment 5

According to the second aspect of the invention, a copper-nickel alloy plating film 22 having a thickness of approximately 0.1 μm is formed on a lead frame body 10, a copper plating film 24 having the same thickness as that of Embodiment 1 is formed on this copper-nickel alloy plating film 22, and a silver plating film 26 is formed on the wire bonding portions of the inner leads, etc. to thereby complete the semiconductor device lead frame.

In this embodiment as well, there was no contamination of the precious metal plating solution (particularly the silver plating solution). Further, the adhesion with the sealing resin when completing the semiconductor device was good.

EXAMPLE 15

A copper-nickel alloy plating film having a thickness of 0.1 μm was formed on a copper alloy material. A copper plating film having a thickness of 0.1 μm was formed on this copper-nickel alloy plating film.

Embodiment 6

According to the third aspect of the invention, a copper-cadmium alloy plating film 22 is formed on a lead frame body 10. The thickness of the copper-cadmium alloy plating film 22 is preferably approximately 0.1 μm. As the copper-cadmium alloy plating solution, use can be made of a usual plating solution. Also the copper-cadmium alloy plating film has a ratio of 10 to 90 wt % of copper and the remainder of cadmium.

Next, a precious metal plating film 26 made of silver, gold, palladium, a double layer of a lower layer palladium and an upper layer of gold, or the like is formed on the die pad of the lead frame body 10 and on the wire bonding portions of the inner leads to thereby complete the semi-conductor device lead frame.

In this embodiment as well, there was no contamination of the precious metal plating solution (particularly the silver plating solution). Further, the adhesion with the sealing resin when completing the semiconductor device was good.

EXAMPLE 16

A copper-cadmium alloy plating film having a thickness of 0.1 μm was formed on the copper alloy material.

Embodiment 7

According to the second aspect of the invention, a copper-cadmium alloy plating film 22 having a thickness of approximately 0.1 μm is formed on a lead frame body 10, a copper plating film 24 having the same thickness as that of Embodiment 1 is formed on this copper-cadmium alloy plating film 22, and a silver plating film is formed on the wire bonding portions of the inner leads etc. to thereby complete the semiconductor device lead frame.

In this embodiment as well, there was no contamination of the silver plating solution. Further, the adhesion with the sealing resin when completing the semiconductor device was good.

EXAMPLE 17

A copper-cadmium alloy plating film having a thickness of 0.1 μm was formed on a copper alloy material. A copper plating film having a thickness of 0.1 μm was formed on this copper-cadmium alloy plating film.

Further, for comparison, various plating films were formed on a copper alloy material as follows.

COMPARATIVE EXAMPLE 1

A copper plating film having a thickness of 0.1 μm was formed on a copper alloy material.

COMPARATIVE EXAMPLE 2

A copper plating film having a thickness of 0.3 μm was formed on a copper alloy material.

COMPARATIVE EXAMPLE 3

A copper (50) and zinc (50) alloy plating film having a thickness of 0.1 μm was formed on a copper alloy material.

COMPARATIVE EXAMPLE 4

A copper (50) and zinc (50) alloy plating film having a thickness of 0.3 μm was formed on a copper alloy material.

COMPARATIVE EXAMPLE 5

A copper (80) and zinc (20) alloy plating film having a thickness of 0.1 μm was formed on a copper alloy material.

COMPARATIVE EXAMPLE 6

A copper (80) and zinc (20) alloy plating film having a thickness of 0.3 μm was formed on a copper alloy material.

COMPARATIVE EXAMPLES 7 and 8

A zinc plating film having a thickness of 0.1 μm was formed on a copper alloy material. A copper plating film having a thickness of 0.5 μm or 1.0 μm was formed on this zinc plating film.

COMPARATIVE EXAMPLES 9 and 10

A copper (50) and zinc (50) alloy plating film having a thickness of 0.1 μm was formed on a copper alloy material. A copper plating film having a thickness of 0.5 μm or 1.0 μm was formed on this copper (50) and zinc (50) alloy plating film.

COMPARATIVE EXAMPLES 11 and 12

A copper (80) and zinc (20) alloy plating film having a thickness of 0.1 μm was formed on a copper alloy material.

A copper plating film having a thickness of 0.5 μm or 1.0 μm was formed on this copper (80) and zinc (20) alloy plating film.

The results of a peeling test of the oxide film after the heating test of test pieces and the resin shearing strength are shown in Table 1.

TABLE 1

|  | Under plating (μm) | Oxide film tape peeling test after heating (300° C. × 5 min) | Resin shearing strength | | |
|---|---|---|---|---|---|
|  |  |  | Before heating | 270° C. × 5 min. | 300° C. × 5 min |
| Example 1 | Cu/Zn 0.1/0.01 | VG | VG | VG | VG |
| Example 4 | Cu/Zn 0.3/0.01 | VG | VG | VG | G |
| Example 10 | Cu/Ag 0.1/0.01 | G | VG | G | F |
| Example 11 | Cu/Sn 0.1/0.01 | G | VG | G | F |
| Example 12 | Cu/Fe 0.1/0.02 | G | VG | G | F |
| Example 13 | Cu/Cd 0.1/0.01 | G | VG | G | F |
| Example | Cu—Ni 0.1 | G | VG | G | F |
| Example 15 | Cu/Cu—Ni 0.1/0.1 | VG | VG | G | G |
| Example 16 | Cu/Cd 0.1 | G | VG | G | F |
| Example 17 | Cu/Cu—Cd 0.1/0.1 | G | VG | G | F |
| Comp. Ex. 1 | Cu 0.1 | P | G | P | P |
| Comp. Ex. 2 | Cu 0.3 | P | VG | P | P |

Tape peeling test (SEMI G62-95 test)
P (Poor): 50 to 10% peeling
G (Good): 10 to 0% peeling
VG (Very good): 0%
Resin shearing strength (SEMI G62-96 test)
P (Poor): <250 gf/mm²
F (Fair): 250 to 500 gf/mm²
G (Good): 500 to 750 gf/mm²
VG (Very good): >750 gf/mm²

As clear from Table 1, particularly when a double-layer plating film of zinc plating or copper-zinc-alloy plating and copper plating is formed on a copper alloy material as in Examples 1 and 4, both of the peeling strength of the oxide film after heating and the resin shearing strength are excellent.

In the case of Examples 10 to 17 as well, it is seen that both of the peeling strength of the oxide film after heating and the resin shearing strength are excellent in comparison with Comparative Examples 1 and 2 wherein only a copper plating film (copper strike plating film) was formed on the copper alloy material.

In the oxide film tape peeling test, the surface of the specimen after the heating was finely scored vertical and horizontally, an adhesive tape was adhered, and how much the oxide film adhered to the adhesive tape side when peeling off the adhesive tape was examined (SEMI G62-95 test method).

The resin shearing strength is the size of the external force when peeling starts to occur when forming a resin mold on one surface of the test piece and applying an external force to this resin mold from a lateral direction (SEMI G62-96 test method).

In the case of a copper alloy-based material, trace amounts of tin, iron, phosphorus, etc. are contained in the copper.

As shown in FIG. 4, if just forming a copper plating film on the material 8, when conducting a heating test, the copper plating film at the surface layer is oxidized and a copper oxide layer 2 is formed, then oxygen penetrates into the lower layer copper alloy material 8, a segregation layer 4 of the additional element is formed on the surface side of the copper alloy material 8, the density of the copper oxide layer 2 and segregation layer 4 become very different from that of the copper alloy material 8, and mismatching or incoherency easily occurs, so the copper oxide layer 2 is peeled off together with the segregation layer 4.

As opposed to this, when heating a lead frame having the plating structure of the present invention shown in FIG. 2, as shown in FIG. 5, the copper plating film 24 of the surface layer (FIG. 2) is oxidized and a copper oxide layer 25 (FIG. 5) is first formed. Further, the oxygen penetrating to the lower layer oxidizes the zinc plating film 22 to form a copper oxide and zinc layer 27. However, the oxygen does not penetrate down to the copper alloy material 8 of the further lower layer, so no segregation layer 4 of the additional element as shown in FIG. 4 is formed. Due to this, the peeling of the copper oxide layer is greatly reduced. In the other embodiments of the present invention as well, the oxidation of the copper alloy material 8 is suppressed, and, as a result, the peeling of the surface layer copper oxide layer is suppressed.

Table 2 shows various under platings and results of evaluation of the plating characteristics.

The test methods used for evaluating the characteristics in Table 2 were as follows in 1) to 8):
1) Package Reliability Test (MSL)
   Moisture absorbing conditions: 85° C./85%RH×168 hours
   Infrared heating: Reaches highest level at 240° C. three times
   (Based on level I, JESD 22-B10-B)
   Die pad back surface peeling
     P (Poor): >80%
     F (Fair): 5 to 80%,
     G (Good): 0 to 5%
2) Adhesion of Under Plating Oxide Film
   Heating conditions: 300° C.×5 min or 400° C.×2 min
   Tape peeling test after heating
   Peeling rate
     P (Poor): 50 to 10%
     F (Fair): <10%
     G (Good): 0%
3) Ag Plating Characteristic
   Same as above 2).
4) Adhesion of Under Plating Oxide Film After Ag Plating
   Same as above 2).
5) Corrosion Resistance
   Constant temperature and constant humidity test: 85° C./85%RH×1 hour
   (Based on EIAJ, ED-4701)
   Salt water spray test: 5% of NaCl/35° C.×1 hour
   (Based on JIS H8502)
   Appearance
     P (Poor): Not acceptable
     F (Fair): Acceptable
     G (Good): Excellent
6) Solder Plating Property
   Based on following test methods
   JIS H8645 Appearance test of plating JIS H8502 Corrosion resistance test method of plating
JIS H8504 Adhesion test method of plating
Evaluation
    P (Poor): Not acceptable
    F (Fair): Acceptable
    G (Good): Excellent
7) Solder bonding strength Held at high temperature: 100° C.×1000 hours (Based on EIAJ, ED-4701B-111)
    Test piece bonding portion: 15 mm×2 mm
    Evaluation
        P (Poor): <20 N/mm$^2$
        F (Fair): 20 to 40 N/mm
        G (Good): >40 N/mm$^2$
8) Total Evaluation
    VG (Very good): Very effective
    G (Good): Effective
    F (Fair): Improvement needed
    P (Poor: No effect In Comparative Examples 1 and 2, it is shown that a segregation layer is formed after the heating test, and the oxide film peels off. In Comparative Examples 4 to 6, the adhesion of the heat resistant oxide film is good, but the zinc is exposed at the surface, so the zinc leaches into the silver plating solution when applying the silver plating, the silver is precipitated on the test piece side, black patches are formed on the test piece surface, and the appearance is degraded. When further continuing the silver plating, there arises a problem in that crystal grains of silver are formed at the surface and considerably degrade the plating appearance.

The reason why the adhesion of the silver plating film after the heating test is good in Comparative Examples 4 to 6 is considered to be the modification of the abnormally precipitated silver plating film by the heating.

In silver plating, the plating solution leaks to the side wall or back side of the inner leads, so a plating film inferior in

TABLE 2

| | Under plating | Package reliability test (MSL) | Under plating oxide film adhesion | Ag plating characteristic | Under plating oxide film adhesion after Ag plating | Corrosion resistance | Solder plating property | Solder bonding strength | Total evaluation |
|---|---|---|---|---|---|---|---|---|---|
| Comp. Ex. 1 | 0.1 μm Cu plating | P | P | G | P | F | G | G | P |
| Comp. Ex. 2 | 0.3 μm Cu plating | P | P | G | P | F | G | G | P |
| Comp. Ex. 3 | 0.1 μm 50Cu–50Zn plating | G | VG | F | R | P | F | F | P |
| Comp. Ex. 4 | 0.3 μm 50Cu–50Zn plating | G | VG | F | R | F | F | F | P |
| Comp. Ex. 5 | 0.1 μm 90Cu–20Zn plating | G | VG | F | R | P | F | F | P |
| Comp. Ex. 6 | 0.3 μm 80Cu–20Zn plating | G | VG | F | R | F | F | F | P |
| Ex. 1 | 0.1/0.01 μm double layer plating of Cu/Zn | G | VG | G | G | G | G | G | VG |
| Ex. 2 | 0.3/0.01 μm double layer plating of Cu/Zn | G | VG | G | G | G | G | G | VG |
| Ex. 3 | 0.4/0.01 μm double layer plating of Cu/Zn | G | VG | G | G | G | G | G | VG |
| Comp. Ex. 7 | 0.5/0.01 μm double layer plating of Cu/Zn | G | VG | G | G | G | F | F | G |
| Comp. Ex. 8 | 1.0/0.01 μm double layer plating of Cu/Zn | G | VG | G | G | G | P | P | G |
| Ex. 4 | 0.1/0.01 μm double layer plating of Cu/50Cu–50Zn | G | VG | G | G | G | G | G | VG |
| Ex. 5 | 0.3/0.01 μm double layer plating of Cu/50Cu–50Zn | G | VG | G | G | G | G | G | VG |
| Ex. 6 | 0.4/0.01 μm double layer plating of Cu/50Cu–50Zn | G | VG | G | G | G | G | G | VG |
| Comp. Ex. 9 | 0.5/0.01 μm double layer plating of Cu/50Cu–50Zn | G | VG | G | G | G | F | F | G |
| Comp. Ex. 10 | 1.0/0.01 μm double layer plating of Cu/50Cu–50Zn | G | VG | G | G | G | P | P | P |
| Ex. 7 | 0.1/0.01 μm double layer plating of Cu/80Cu–20Zn | G | VG | G | G | G | G | G | VG |
| Ex. 8 | 0.3/0.01 μm double layer plating of Cu/80Cu–20Zn | G | VG | G | G | G | G | G | VG |
| Ex. 9 | 0.4/0.01 μm double layer plating of Cu/80Cu–20Zn | G | VG | G | G | G | G | G | VG |
| Comp. Ex. 11 | 0.5/0.01 μm double layer plating of Cu/80Cu–20Zn | G | VG | G | G | G | F | F | G |
| Comp. Ex. 12 | 1.0/0.01 μm double layer plating of Cu/80Cu–20Zn | G | VG | G | G | G | P | P | P |

As clear from Table 2, all test pieces of the examples of the present invention are excellent in the adhesion of the oxide film, characteristics after silver plating, corrosion resistance, appearance of outer lead solder plating, and the soldering property in comparison with the test pieces of the comparative examples.

adhesion is formed at those locations. It is necessary to peel off this silver plating film. Looking at the silver plating peeling characteristic, in the case of Comparative Examples 4 to 6, the zinc leaches into the acid peeling solution and, in the heating test after that, in the same way as Comparative Examples 1 and 2, the adhesion of the oxide film of the under plating film (copper-zinc alloy plating) is poor and the original characteristics of the copper-zinc alloy plating film are not exhibited.

Further, it is also seen that there is the problem in the corrosion resistance in Comparative Examples 1 to 6.

On the other hand, as pretreatment of the external solder plating, generally the surface is washed by an alkali to remove the resin flashes, then the under plating film is peeled off by a peeling solution containing about 10 to 15 v/v % of sulfuric acid. During this alkali washing, the zinc, which is an amphoteric metal and has a fast reaction speed with the alkali washing solution, leaches into the alkali washing solution. For this reason, the solder plating film is abnormally precipitated in the solder plating after that, patches are formed in the heating test of the solder plating film, and the plating appearance is degraded.

In Comparative Examples 7, 9, and 11, a copper plating film having a thickness of 0.5 μm was formed. The appearance of the outer lead solder plating was somewhat poor, and also the soldering strength was slightly lowered. The reason for this can be considered to be that the copper plating film was formed thick, so the under plating could not be sufficiently peeled off and some of the zinc component remained.

In Comparative Examples 8, 10, and 12, a copper plating film having a thickness of 1.0 μm was formed. The above tendency conspicuously appeared, the appearance of the solder plating film was poor, and also the soldering strength was lowered.

Figure 6:
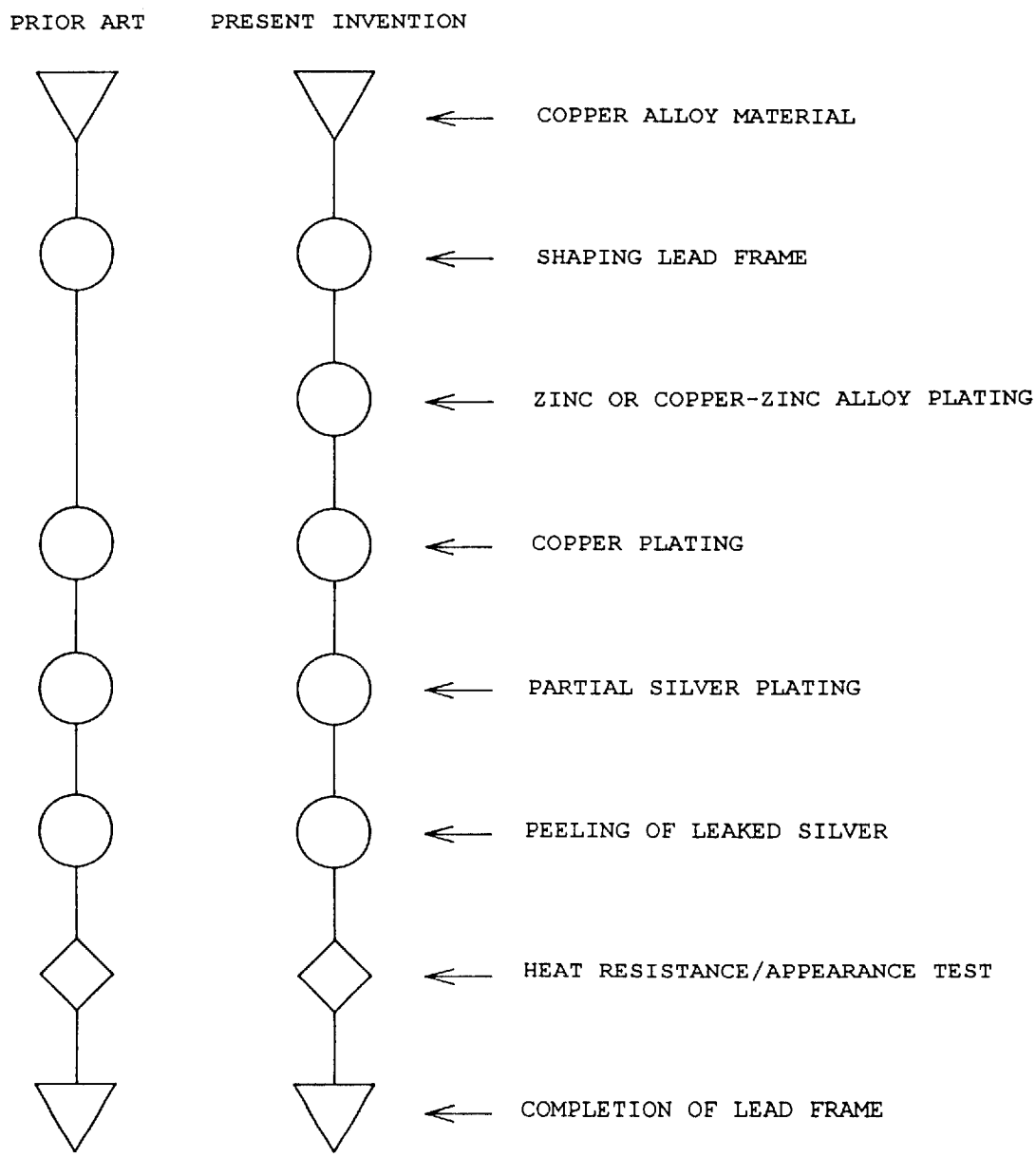
FIG. 6 is a flowchart comparing a process of production of a lead frame of the prior art and a process of production of a lead frame of the present embodiment.

FIG. 6 shows a comparison between the conventional process of production of a lead frame and the process of production of a lead frame according to the first or second aspect of the invention.

Figure 7:
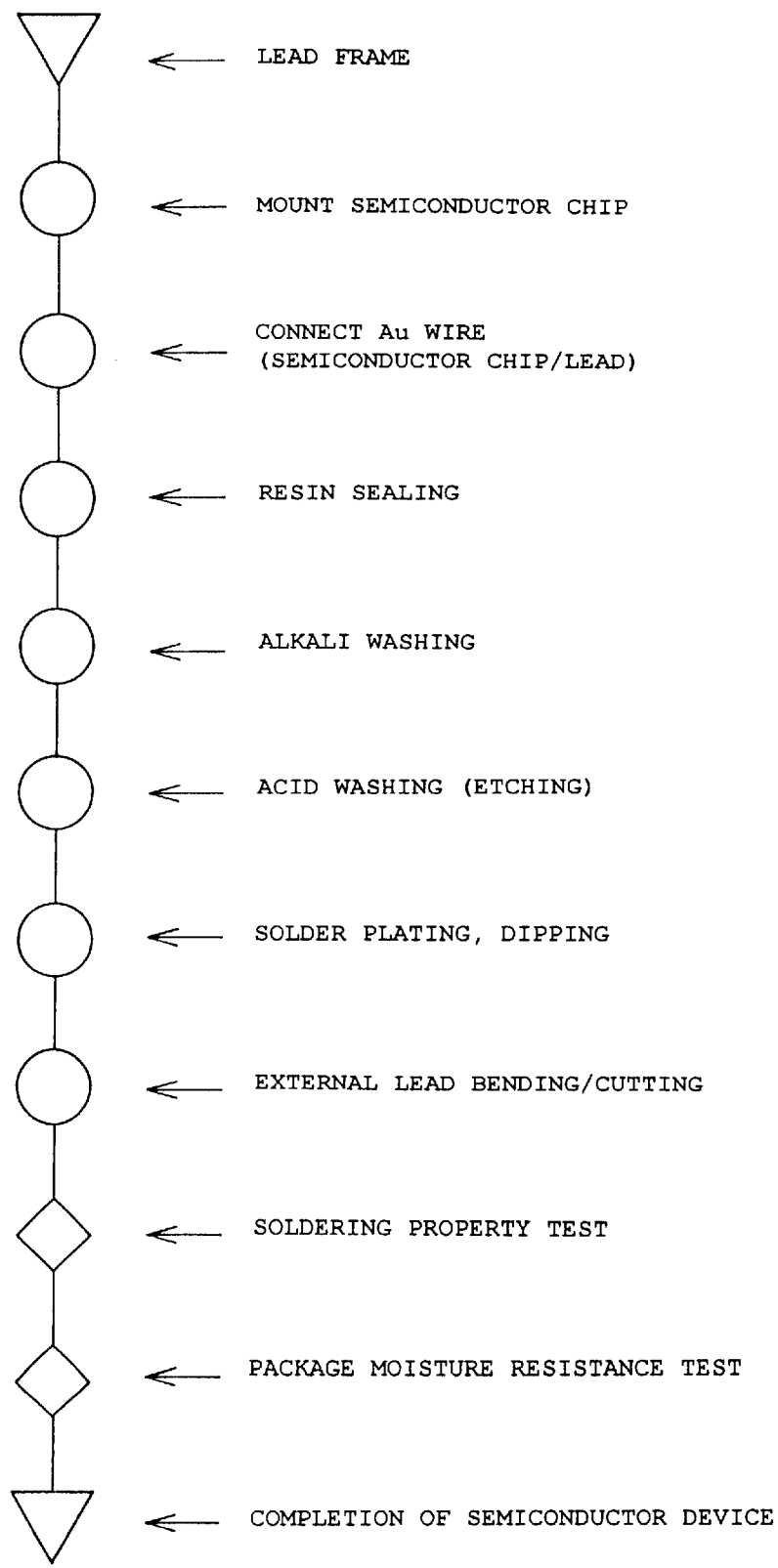
FIG. 7 is a flowchart of the process of production of a standard semiconductor device.

FIG. 7 shows the process of production of a standard semiconductor device.

Thickness of Copper Upper Layer of Under Plating Film

The range of thickness of the copper upper layer of the under plating film necessary in order to obtain the effects of the present invention was investigated in detail.

Double-layer under plating films comprised of a lower layer made of a copper (50) and zinc (50) alloy and an upper layer made of copper of various thicknesses were formed on a copper alloy (Cu and 1 to 3 wt % Sn alloy) material and tested by the same test methods as in Table 2. The plating conditions were the same as the method explained in Embodiment 1. The results are shown all together in Table 3.

As shown in Table 3, even if changing the thickness of the copper-zinc alloy lower layer within a range of 0.01 to 0.1 μm, good results were obtained for all characteristics if the thickness of the copper upper layer was within a range of 0.02 to 0.4 μm.

Namely, if the thickness of the copper upper layer is less than 0.02 μm, the reliability of the package, the adhesion of the under plating oxide film, the adhesion of the under plating oxide film after the silver plating, the solder plating property, and the solder bonding strength are lowered. On the other hand, if the thickness of the copper upper layer exceeds 0.4 μm, the solder bonding strength is lowered. In order to secure good levels of all of these characteristics, it is necessary to control the thickness of the copper upper layer of the under plating film to within a range of 0.02 to 0.4 μm.

TABLE 3

| Cu thickness (upper layer) *1 | Cu–Zn (50:50) thickness (lower layer) *2 | Package reliability test (MSL) | Under plating oxide film adhesion | Under plating oxide film adhesion after Ag plating | Ag plating property | plating property | Solder bonding strength | Solder Total evaluation |
|---|---|---|---|---|---|---|---|---|
| A | a | P | P | P | G | F | G | P |
|   | b | F | P | P | G | F | G | P |
|   | c | F | P | P | G | F | G | P |
|   | d | F | P | P | G | P | G | P |
| B | a | G | G | F | G | G | G | G |
|   | b | G | G | G | G | G | G | VG |
|   | c | G | G | G | G | G | G | VG |
|   | d | G | G | G | G | G | G | VG |
| C | a | G | G | G | G | G | G | VG |
|   | b | G | G | G | G | G | G | VG |
|   | c | G | G | G | G | G | G | VG |
|   | d | G | G | G | G | G | G | VG |
| D | a | G | G | G | G | G | G | VG |
|   | b | G | G | G | G | G | G | VG |
|   | c | G | G | G | G | G | G | VG |
|   | d | G | G | G | G | G | G | VG |
| E | a | G | G | G | G | G | F | G |
|   | b | G | G | G | G | G | F | G |
|   | c | G | G | G | G | G | P | P |
|   | d | G | G | G | G | G | P | P |

TABLE 3-continued

| Cu thickness (upper layer) *1 | Cu–Zn (50:50) thickness (lower layer) *2 | Package reliability test (MSL) | Under plating oxide film adhesion | Under plating oxide film adhesion after Ag plating | Ag plating property | plating property | Solder bonding strength | Solder Total evaluation |
|---|---|---|---|---|---|---|---|---|
| F | a | G | G | G | G | G | P | P |
|   | b | G | G | G | G | G | P | P |
|   | c | G | G | G | G | G | P | P |
|   | d | G | G | G | G | G | P | P |

*1) Upper layer Cu thickness
A: 0.01 μm
B: 0.02 μm
C: 0.1 μm
D: 0.4 μm
E: 0.5 μm
F: 1.0 μm
*2) Lower layer Cu–Zn thickness
a: 0.01 μm
b: 0.1 μm
c: 0.5 μm
d: 1.0 μm

CAPABILITY OF UTILIZATION IN INDUSTRY

The present invention provides a semiconductor device lead frame excellent in adhesion with the sealing resin, free from contamination of the precious metal plating solution (particularly the silver plating solution), having a good appearance of the precious metal plating film, excellent in the corrosion resistance and moisture resistance, and having a good appearance and adhesion of the outer lead solder plating film, a process of production of the same, a semiconductor device using the lead frame, and a process of production of the same.

What is claimed is:

1. A process of production of a semiconductor device comprising:

a step of forming a lead frame body made of copper or a copper alloy, a step of forming a lower layer plating film made of zinc or a copper-zinc alloy on the lead frame body, a step of forming an upper layer copper plating film having a thickness of 0.02 to 0.4 μm on the zinc or the copper-zinc alloy lower layer plating film and thereby forming an under plating film consisting of the lower layer and the upper layer, a step of forming a precious metal plating film on at least a wire bonding portion of an inner lead of the upper layer copper plating film, a step of mounting a semiconductor chip on a die pad of the lead frame formed with the under plating film and the precious metal plating film, a step of electrically connecting the semiconductor chip and the wire bonding portions of the inner leads of the lead frame by bonding wires, a step of sealing the semiconductor chip with a sealing resin, a step of removing the under plating film consisting of the lower layer and the upper layer from the outer leads of the lead frame, and a step of forming a solder plating film on the exposed outer leads.

2. A semiconductor device lead frame made of copper or a copper alloy and used for a resin sealing semiconductor device, comprising:

a lead frame body made of copper or a copper alloy, and having outer leads, a double-layer under plating film formed on the lead body and consisting of a lower layer made from the group of zinc and a copper-zinc alloy, and an upper layer made of copper having a thickness of 0.02 to 0.4 μm, and a precious metal plating film formed on at least a wire bonding portion of an inner lead of said copper upper layer of the under plating film, wherein also electrically connecting said semiconductor device and the wire bonding portions of said inner leads by bonding wires, and sealing said semiconductor device by a resin, and wherein said double-layer under plating film formed on the outer leads of the lead frame is removed and a solder plating film is formed on the exposed outer leads.

3. The semiconductor device lead frame of claim 2, wherein the thickness of the copper upper layer is 0.1 to 0.3 μm.

4. The semiconductor device lead frame of any one of claims 2, and 3, wherein the thickness of the lower layer made from said group of zinc and a copper-zinc alloy is 0.001 to 0.5 μm.

5. A semiconductor device lead frame made of copper or a copper alloy and used for a resin sealing semiconductor device, comprising:

a lead frame body made of copper or a copper alloy, and having outer leads, a double-layer under plating film formed on the lead frame body and consisting of a lower layer made of one type of metal selected from silver, tin, iron, cadmium, a copper-nickel alloy, and copper-cadmium and an upper layer made of copper, and a precious metal plating film formed on at least a wire bonding portion of an inner lead of the copper upper layer of said double-layer under plating film, wherein also electrically connecting the semiconductor device and the wire bonding portions of said inner leads by bonding wires, and sealing said semiconductor device by a resin, and wherein said double-layer under plating film formed on the outer leads of the lead frame is removed and a solder plating film is formed on the exposed outer leads.

6. The semiconductor device lead frame of claim 5, wherein the thickness of the copper upper layer is 0.1 to 0.3 µm.

7. The semiconductor device lead frame of any one of claims 5 and 6, wherein the thickness of the lower layer made from the group of zinc and a copper-zinc alloy is 0.001 to 0.5 µm.

8. A semiconductor device lead frame made of copper or a copper alloy and used for a resin sealing semiconductor device, comprising:

a lead frame body made of copper or a copper alloy, and having outer leads, an under plating film, made from the group of a copper-nickel alloy and a copper-cadmium alloy, formed on the lead frame body, and a precious metal plating film formed on at least a wire bonding portion of an inner lead of said under plating film, wherein also electrically connecting the semiconductor chip and the wire bonding portions of said inner leads by bonding wires, and sealing said semiconductor device by a resin, and wherein said under plating film formed on said outer leads of said lead frame is removed and a solder plating film is formed on the exposed outer leads.

* * * * *